United States Patent [19]
Phillips et al.

[11] Patent Number: 5,748,455
[45] Date of Patent: May 5, 1998

[54] ELECTROMAGNETIC SHIELD FOR A RADIOTELEPHONE

[75] Inventors: John C. Phillips, Holly Springs; Craig A. Phelps, Raleigh, both of N.C.

[73] Assignee: Ericsson, Inc., Research Triangle Park, N.C.

[21] Appl. No.: 636,860

[22] Filed: Apr. 23, 1996

[51] Int. Cl.⁶ ........................................................ H05K 9/00
[52] U.S. Cl. ........................... 361/818; 361/753; 361/799; 361/800; 361/814; 361/816; 174/35 R; 174/35 TS
[58] Field of Search ........................... 361/752, 753, 361/757, 730, 796, 799, 800, 814, 816, 818, 212, 220; 174/35 R, 35 MS, 35 GC, 35 TS; 439/607, 609; 257/728

[56] References Cited

U.S. PATENT DOCUMENTS

| | | |
|---|---|---|
| 4,654,755 | 3/1987 | Henderson et al. |
| 5,053,924 | 10/1991 | Kurgan. |
| 5,150,282 | 9/1992 | Tomura et al. |
| 5,373,101 | 12/1994 | Barabolak. |
| 5,428,508 | 6/1995 | Pronto. |

FOREIGN PATENT DOCUMENTS 406112680 of 1994 Japan.

Primary Examiner—Leo P. Picard
Assistant Examiner—Phuong T. Vu

[57] ABSTRACT

An electromagnetic shield is incorporated into a radiotelephone. The radiotelephone includes a printed circuit board having a ground trace extending around an electrical circuit formed on the printed circuit board. The electromagnetic shield is disposed adjacent the printed circuit board for isolating the electrical circuit thereon. Forming a part of the electromagnetic shield is a face, a side wall, and a series of spaced apart spring contacts that extend from the side wall for electrical contact with the ground trace on the printed circuit board. Disposed over the shield is a housing structure that engages the shield and urges the shield against the printed circuit board such that the spring contacts thereof engage and make electrical contact with the ground trace of the printed circuit board.

39 Claims, 7 Drawing Sheets

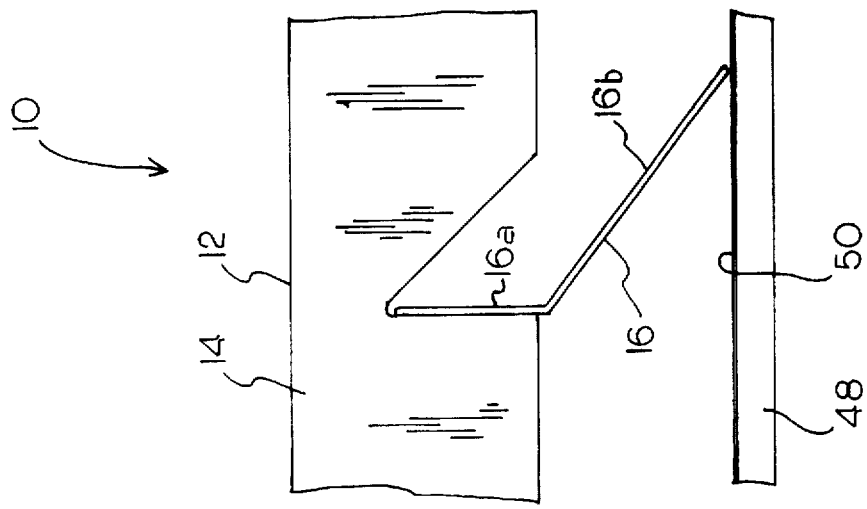
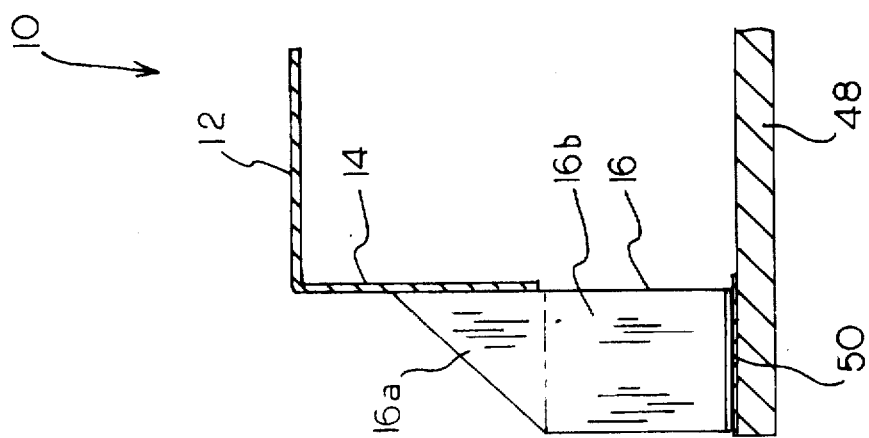

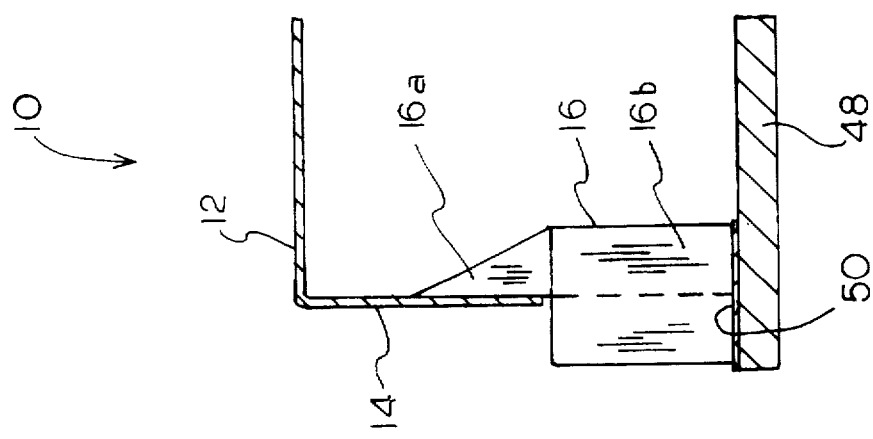
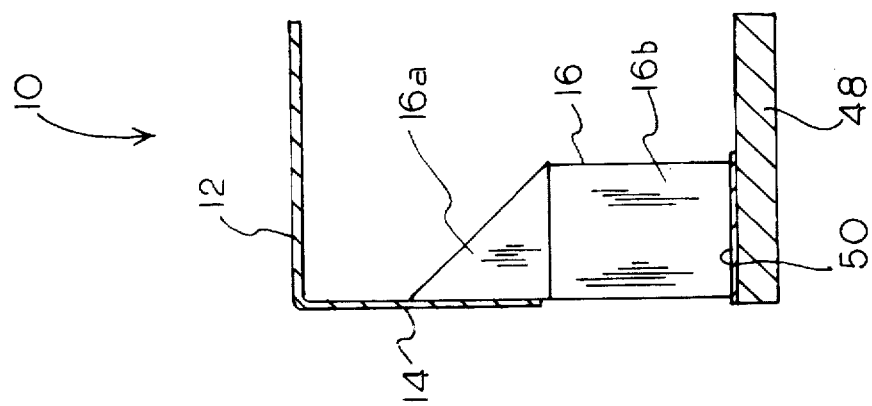

ELECTROMAGNETIC SHIELD FOR A RADIOTELEPHONE

FIELD OF THE INVENTION

The present invention relates to radiotelephones and more particularly to an electromagnetic shield for shielding a printed circuit board within a radiotelephone.

BACKGROUND OF THE INVENTION

Electromagnetic interference is a common and well-known problem associated with electronic equipment. Normal circuit operation creates electromagnetic waves which induce undesirable signals and interfere with the normal operation of other electrical components. These undesirable signals, termed electromagnetic or RF (radio frequency) interference, can be minimized by shielding portions of the circuit within a conductive shield at a low or ground potential. This grounded electromagnetic shield dissipates electrostatic buildup and absorbs the electromagnetic field thereby shielding the circuit from electromagnetic interference.

The same electromagnetic interference concerns are present in the design of radiotelephones. Shielding radiotelephones from electromagnetic interference is essential for optimum circuit performance and communication clarity. Analog circuits are typically very susceptible to electromagnetic interference and must be shielded to ensure proper operation. Digital componentry, while not as susceptible to electromagnetic interference, generate high frequency square waves that create broad band electromagnetic interference. Since current cellular radiotelephones utilize both analog and digital components, shielding the electrical components from electromagnetic contamination is vital for lucid communication between the base station and the terminal.

In the past, it has been common practice to solder an electromagnetic shield to a ground trace formed on a printed circuit board of a radiotelephone. This approach obviously yields excellent conductive contact between the shield and the ground trace of the printed circuit board. However, soldering the electromagnetic shield to the printed circuit board makes inspection and repair of the printed circuit board practically impossible. It is highly desirable for the shield and printed circuit board to be of a design that readily accommodates inspection and repair.

Conductive gaskets can also be used as a conductive interface between an electromagnetic shield and the printed circuit board of a radiotelephone. But they too have drawbacks and shortcomings. In particular, conductive gaskets are relatively expensive and cannot compensate for printed circuit board warpage that exceeds the thickness of the gasket.

Spring clips and fingers have been utilized in radiotelephones for the purpose of maintaining conductive contact between an electromagnetic shield and a ground trace formed on a printed circuit board. See, for example, the disclosure of U.S. Pat. No. 5,053,924 and Japanese Patent No. 6-112680. However, these spring clip and finger designs have not successfully addressed the problem of warpage in the printed circuit board itself. Printed circuit boards have the potential to warp and do in fact warp to such a degree that spring clips and fingers of prior art designs fail to maintain electrical contact around the entire printed circuit board. Most often, the spring clips or fingers are fairly rigid and not designed to flex and move up and down between the electromagnetic shield and the printed circuit board to compensate for warpage.

SUMMARY AND OBJECTS OF THE INVENTION

The present invention relates to an electromagnetic shield for a radiotelephone. The radiotelephone includes a printed circuit board having an electrical circuit and a ground trace formed thereon. The electromagnetic shield is disposed adjacent the printed circuit board for isolating the electrical circuit. The electromagnetic shield includes a face and a side wall extending around the face. A series of spaced apart spring contacts extend from the side wall of the shield and make electrical contact with the ground trace of the printed circuit board. A ho using structure is disposed adjacent the shield and engages the shield and urges the spring contacts into engagement with the ground trace extending around the printed circuit board.

It is therefore an object of the present invention to provide an electromagnetic shield having a plurality of spring contacts for engaging a conductive strip formed on the printed circuit board that allows for relatively large amounts of compression of the spring contacts while still allowing good electrical contact with the ground trace of the printed circuit board.

Still a further object of the present invention is to provide an electromagnetic shield of the character referred to above where the spring contacts are substantially deformable during assembly, thereby lowering the overall force required to assemble the shield while still maintaining an elastic load that assures electrical contact with the printed circuit board due to the inherent "spring back" qualities of the finger contacts.

Another object of the present invention is to provide an electromagnetic shield for a radiotelephone that provides excellent electrical contact between the shield and an adjacent printed circuit board and wherein the shield can be readily removed from the printed circuit board for inspection and repair.

Still a further object of the present invention is to provide an electromagnetic shield having spring contacts that compensate for normal warpage and tolerances up to one millimeter in a printed circuit board.

Other objects and advantages of the present invention will become apparent and obvious from a study of the following description and the accompanying drawings, which are merely illustrative of such invention.

BRIEF DESCRIPTION OF THE DRAWINGS

FIG. 3 is a fragmentary transverse sectional view of an alternate design for the electromagnetic shield.

FIG. 4 is a fragmentary side view of the alternative design of FIG. 3.

FIG. 5 is a fragmentary transverse sectional view of a another alternate design for the electromagnetic shield of the present invention.

FIG. 6 is a fragmentary transverse sectional view of yet another alternate design for the electromagnetic shield of the present invention.

DETAILED DESCRIPTION OF THE INVENTION

Figure 1:
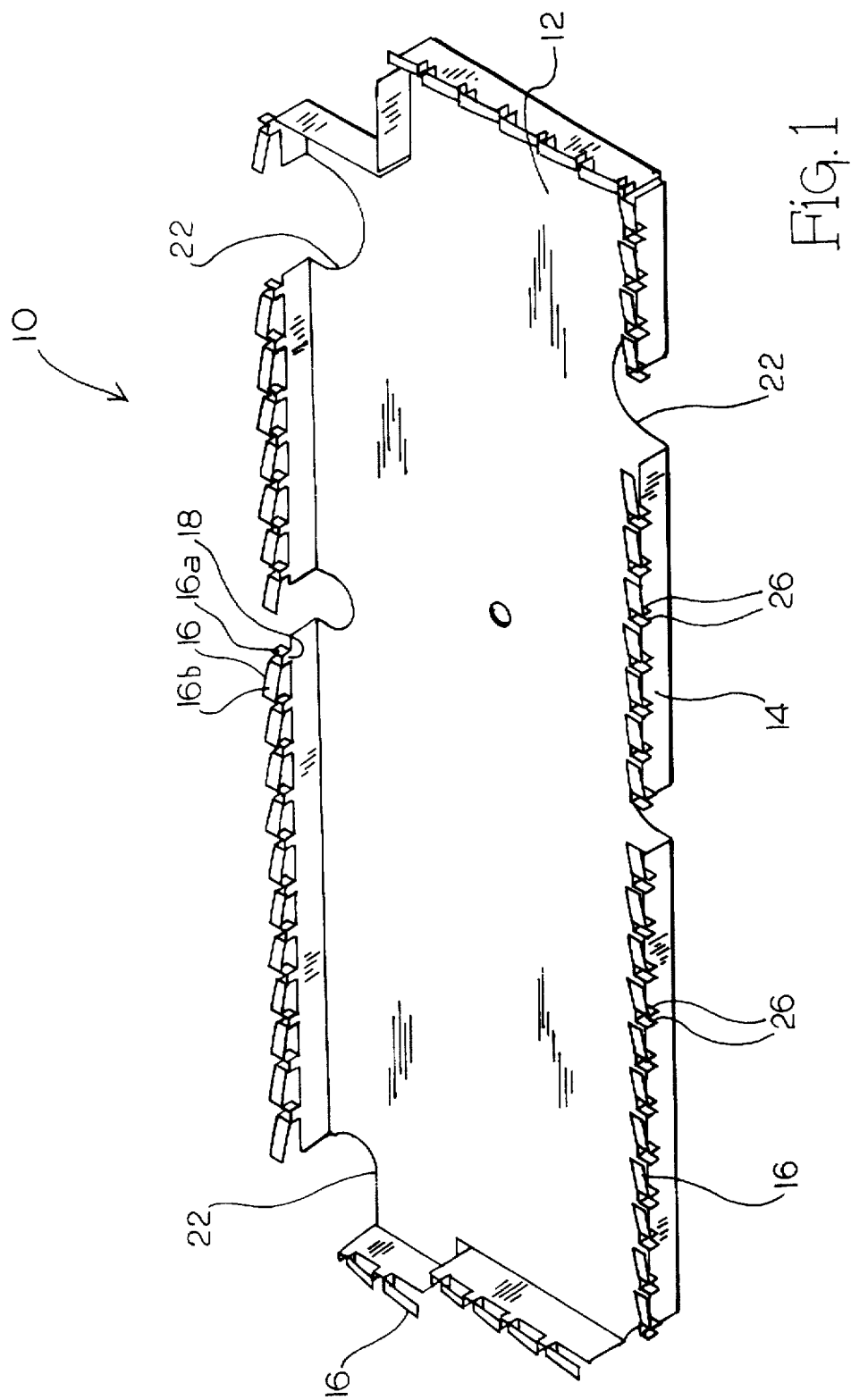
FIG. 1 is a perspective view of the electromagnetic shield of the present invention.
Figure 2:
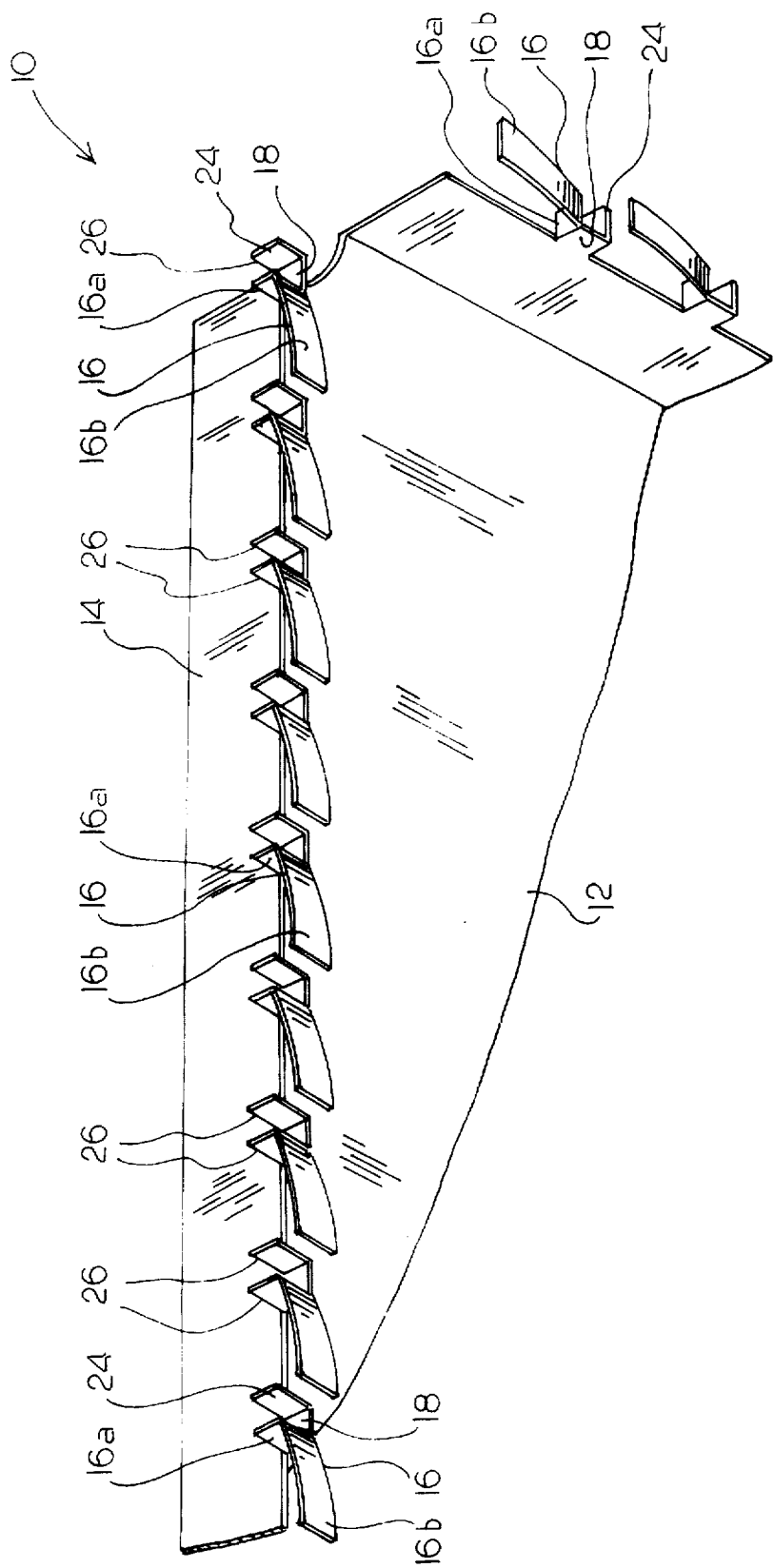
FIG. 2 is an enlarged perspective view of a portion of the electromagnetic shield illustrating the spring contacts thereof.

With reference to the drawings, particularly FIGS. 1 and 2, the electromagnetic shield of the present invention is shown therein and indicated generally by the numeral 10. Shield 10 includes a face 12 and a surrounding side wall 14. Extending from the side wall 14 is a series of spaced apart spring contacts 16 that extend around the perimeter of the shield. Each spring contact 16 includes a finger tab or first tab 16a and a flexible finger 16b (FIG. 2).

Tabs 16a are selectively cut from the side wall 14 and folded outwardly along fold lines such that they project in planes that extend generally perpendicular to the plane of the side wall 14. Fingers 16b are formed by a second set of fold lines that extend between the respective tabs 16a and the fingers 16b. Fingers 16b are designed such that they flex up and down with respect to the face 12 of the electromagnetic shield 10.

Disposed adjacent respective finger or first tabs 16a is a second group of tabs, referred to as second tabs 24. Tabs 24 are disposed between successive spring contacts 16 and extend outwardly from the side wall 14 generally parallel to the finger tabs 16a that form a part of the spring contacts. Thus, as seen in FIGS. 1 and 2, tabs 24 are disposed between successive spring contacts 16. Consequently, tabs 16a and 24 form pairs or sets of tabs around the periphery of the side wall 14. Moreover, tabs 16a and 24 are interconnected by a connecting segment 18 that forms a part of the side wall 14. Tabs 24 generally conform to the design of tabs 16a with the exception that tabs 24 do not include a depending finger 16b.

Tabs 16a and 24 include upper edges 26 that project outwardly from the side wall 14. As will be appreciated from subsequent portions of the disclosure, the upper edges 26 of tabs 16a and 24 collectively define a bearing surface. More particularly, the upper edges 26 of the tabs 16a and 24 are engaged by a second bearing surface (such as a flange of a housing) and the second bearing surface in turn presses the entire shield 10 into contact with a printed circuit board. Thus, the upper edges 26 of tabs 16a and 24 serve the common function of acting as a bearing surface.

Disposed around the periphery of the shield 10 is a series of cut-outs 22. Cut-outs 22 enable screw sleeves or the like to project through the shield 10 when the shield is assembled within a housing structure.

Spring contacts 16 extending from the side wall 14 are flexible and designed to move up and down in a vertical plane relative to face 12 of the shield 10. Thus, it is appreciated that the spring contacts 16 can conform to an irregular or uneven surface, such as a warped printed circuit board, and yet maintain good electrical contact with a ground trace or conductive strip formed on the printed circuit board.

In the case of the embodiment shown in FIGS. 1 and 2, the spring contacts 16 are disposed outwardly of the side wall 14 of the shield. However, the spring contacts 16 can be turned inwardly or outwardly with respect to the side wall 14. In fact, the spring contacts 16 could be cut and folded such that fingers 16b would align with the side wall 14.

FIGS. 3-6 show three alternate designs for the electromagnetic shield 10. In both alternate designs, the spring contacts 16 comprise a triangular shaped tab 16a cut from the side wall 14 and a finger 16b extending from the tab. A printed circuit board 48 having a ground trace 50 is disposed adjacent the shield 10. In the alternate design of FIGS. 3 and 4, the spring contacts 16 are turned outwardly from the side wall 14. FIG. 5 shows the same basic design but with the spring contacts 16 turned inwardly. In the case of the alternate design of FIG. 6, the spring contacts 16 are formed such that the fingers 16b are essentially centered or aligned with the side wall 14. In all three alternate designs, the angle of the upper edge of the tab 16a is not particularly suited to act as a bearing surface as is the upper edges 26 of the tabs 16a and 24 depicted in FIGS. 1 and 2. Thus, with the alternate designs of FIGS. 3-6, the face 10 or a portion thereof could be engaged for the purpose of urging the electromagnetic shield 10 against an adjacent printed circuit board.

Shield 10 is preferably formed from a progressive die cutting operation. Accordingly, the shield including the face 12, the side wall 14, and spring contacts 16 form a one-piece integral structure. Various conductive materials may be used to construct the electromagnetic shield 10. One such material contemplated for the shield 10 is beryllium-copper. Beryllium-copper possesses excellent conductive qualities and also structurally imparts good "spring-back" characteristics to the spring contacts 16.

Figure 7:
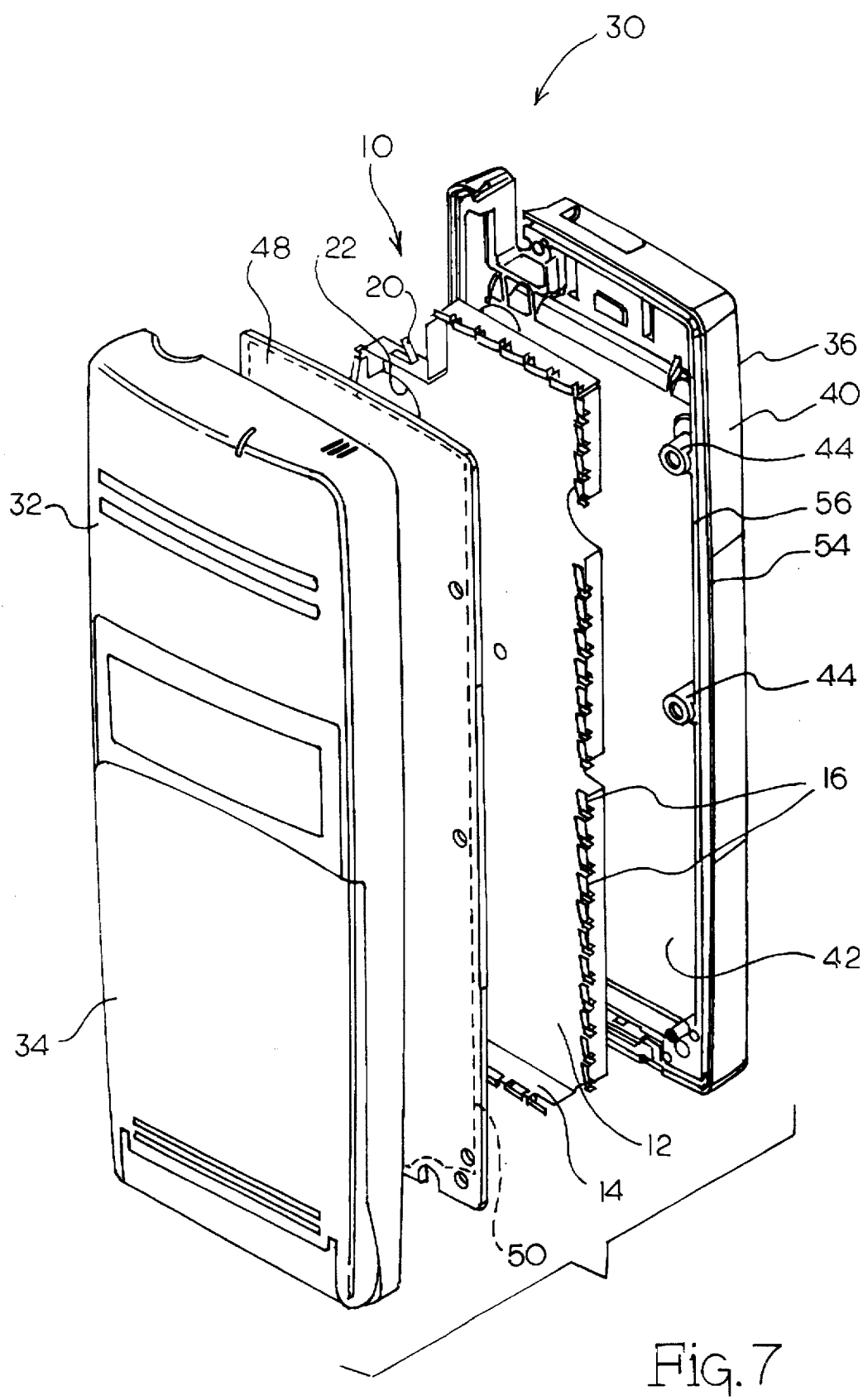
FIG. 7 is an exploded view of a radiotelephone having the electromagnetic shield of the present invention incorporated therein.

Now turning to FIG. 7, the electromagnetic shield 10 of the present invention is shown therein incorporated into a conventional cellular radiotelephone indicated generally by the numeral 30. Radiotelephone 30 includes four basic components, a front housing 32, a printed circuit board 48, the electromagnetic shield 10, and a rear housing 36. Details of the radiotelephone 30 are not disclosed herein because such is not per se material to the present invention and further, cellular radiotelephones are widely available and well-known in the art. By way of an example, radiotelephone 30 may be similar to any one of a number of radiotelephones manufactured by Ericsson, Inc., of Research Triangle Park, North Carolina, such as the Ericsson AH-320.

Figure 8:
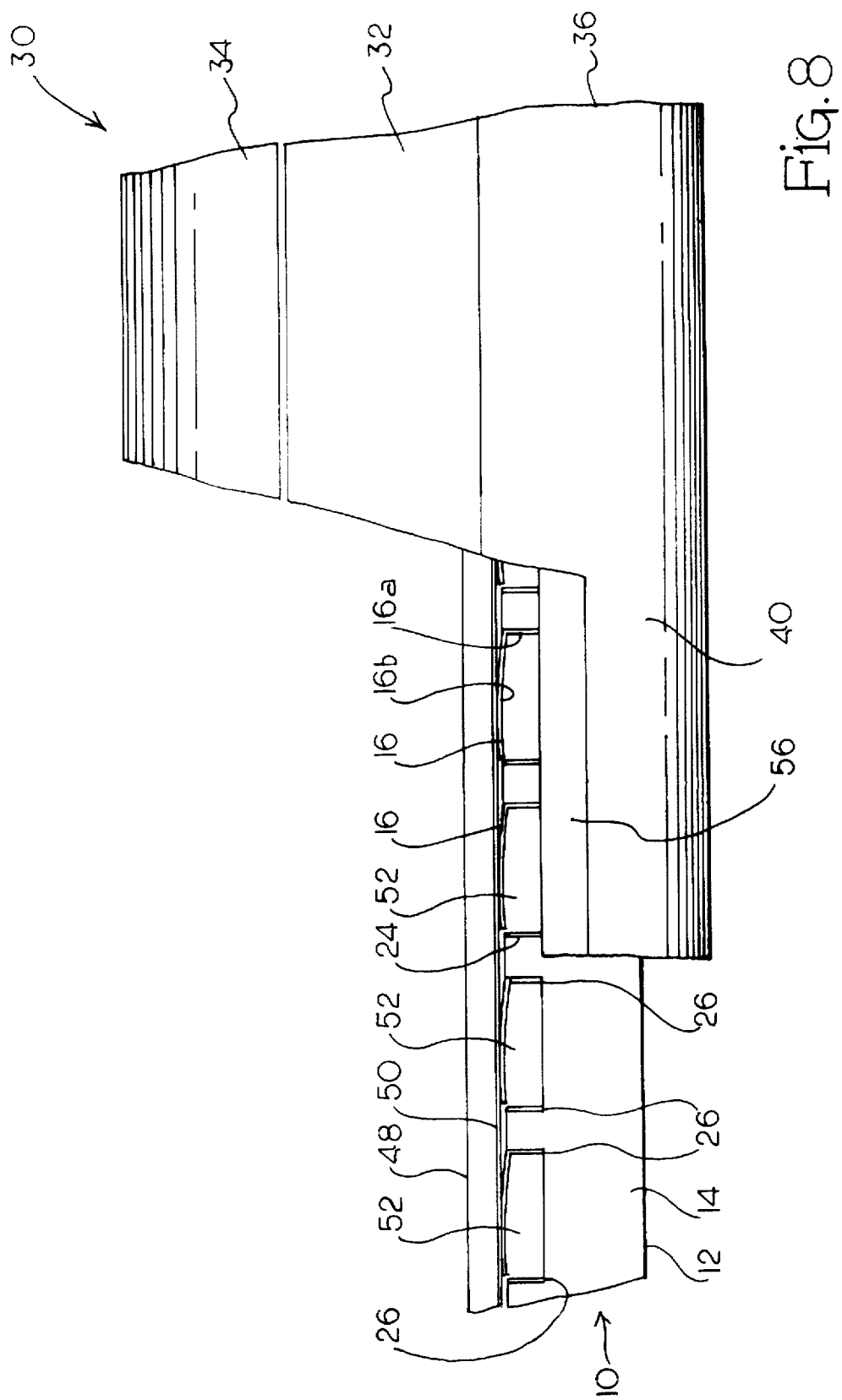
FIG. 8 is a fragmentary side view of the radiotelephone with portions of the housing broken away to illustrate how the back housing urges the electromagnetic shield into contact with the printed circuit board.
Figure 9:
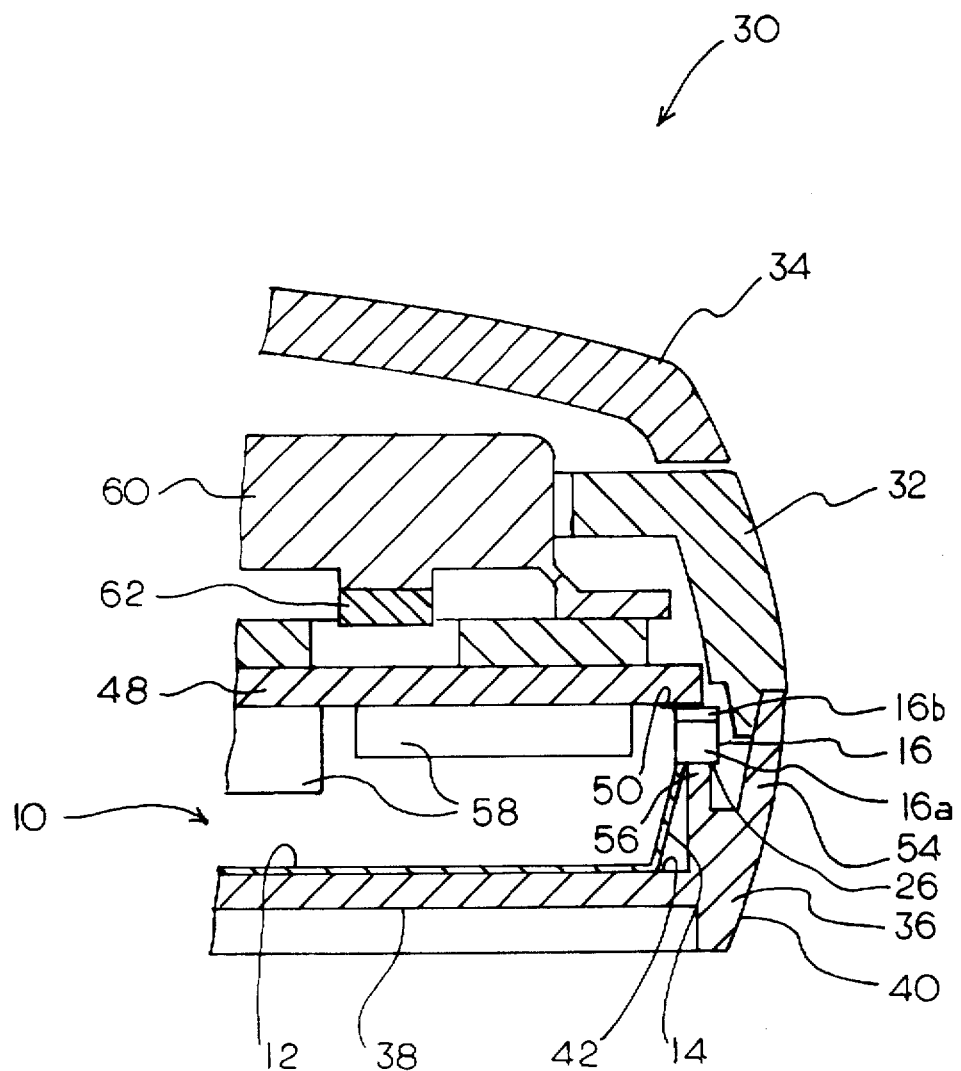
FIG. 9 is a fragmentary cross-sectional view of the radiotelephone.

As illustrated in FIGS. 7-9, the printed circuit board 48 and shield 10 are sandwiched between front housing 32 and back housing 36. A ground trace or conductive strip 50 extends around numerous electrical components 58 secured to the printed circuit board 48 and which face the shield 10.

Front housing 32 is of a conventional design and includes a flip cover 34 that, in a closed position, protects a keyboard. A portion of the keyboard is schematically illustrated in FIG. 8. The keyboard overlies the printed circuit board 48 and includes a series of push-buttons 60 which are operative to actuate underlying pills 62.

Back housing 36 includes a back 38, side wall 40, and an inner cavity 42. Disposed around the perimeter of the back housing 36 is a series of spaced apart screw sleeves 44. Screw sleeves 44 align with and project through respective cut-outs 22 formed in the adjacent shield 10.

Formed around the outer perimeter of the back housing 36 is an outer flange 54. Outer flange 54 abuts against a surrounding edge of the front housing 32. (FIG. 9). Indented inwardly from the outer flange 54 is an inner flange 56 that extends around a substantial perimeter portion of the back housing 36. Inner flange 56 engages the upper edges 26 of the tabs 16a and 24 that form a part of the shield 10 shown in FIGS. 1 and 2. In fact, inner flange 56 engages and bears against the upper edges 26 and pushes the spring contacts 16 into electrical contact with the ground trace 50 extending around the printed circuit board 48. When assembled, as shown in FIGS. 8 and 9, shield 10 nests within the cavity 42 formed in the back housing 36. Screws (not shown) extend through the screw sleeves 44 and connect the back housing 36 to the front housing 32. Printed circuit board 48 is sandwiched between the front housing 32 and the shield 10. When the radiotelephone 30 is assembled, the back housing 36 urges the spring contacts 16 and the shield 10 towards the printed circuit board 48 such that the fingers 16b engage the ground trace 50 extending around the printed circuit board 48 (FIGS. 8 and 9). Thus, a continuous and uniform force is applied around the entire shield 10, through tabs 16a and 24, by the inner flange 56 of the back housing 36.

Also, as shown in FIG. 8, a series of openings 52 are formed around the perimeter of the shield 10. Each opening 52 is generally bounded by a finger 16b, tabs 16a and 24, the terminal edge of the side wall 14 and the printed circuit board 48. Preferably, the size of each opening 52 should be limited such that the largest dimension of the opening does not exceed one-tenth of the wave length of the frequency being shielded. It is contemplated that in conventional applications related to radiotelephones, that the longest dimension of a respective opening 52 should not exceed 3 to 6 millimeters.

In some cases, it may be desirable to provide additional contacts for the purpose of grounding certain components of the radiotelephone 30. For example, in FIG. 7, shield 10 is provided with a spring contact 20 that projects outwardly from the side wall 14. Spring contact 20 is simply cut and folded outwardly from the side wall 14 such that it projects outwardly for electrical contact with an adjacent structure such as antenna connectors, speaker connectors, etc.

Shield 10 of the present invention includes numerous advantages over conventional electromagnetic shields such as those that are designed to be soldered to a printed circuit board. Shield 10 is designed to maintain good electrical contact with the ground trace 50 of the printed circuit board 48 while still permitting the shield 10 to be easily and quickly removed for purposes of inspection and repair of the printed circuit board. Moreover, the spring contacts 16 of the shield can withstand substantial compression without adversely affecting the ability of the fingers 16b to maintain good electrical contact with the adjacent ground trace 50. The vertical tolerance that can be absorbed by the spring contacts 16 is generally dependent on the elastic limit or yield strength of the material of the shield. The shield design of the present invention is unique in that a large amount of deflection in the spring contacts 16 can take place, but still there will be some "spring back" qualities in the spring contacts 16 when the load is relaxed, assuring electrical contact between the shield and the ground trace 50 of the printed circuit board 48.

Finally, printed circuit boards are prone to warp. Because of the flexibility of the spring contacts 16 and their ability to flex up and down with respect to the face 12 of the shield, good electrical contact between the ground trace 50 and the fingers 16b is maintained even in cases where the printed circuit board has experienced normal warpage of up to 1 millimeter.

The present invention may, of course, be carried out in other specific ways than those herein set forth without parting from the spirit and essential characteristics of the invention. The present embodiments are, therefore, to be considered in all respects as illustrative and not restrictive, and all changes coming within the meaning and equivalency range of the appended Claims are intended to be embraced therein.

What is claimed is:

1. An electromagnetic shield for shielding an electrical circuit disposed on a circuit board having a conductive strip extending around the electrical circuit, comprising:
    a) a face;
    b) a side wall extending around at least a portion of the face;
    c) a series of spring contacts extending from the side wall for electrical contact with the conductive strip extending around the circuit board, the spring contacts being flexible and movable up and down relative to the face of the shield and forming an integral one-piece construction with the side wall;
    d) each spring contact including a first tab that projects from the plane of the sidewall and a finger that extends from the first tab and flexes about a fold line extending between the first tab and the finger; and
    e) wherein the shield is installed between the circuit board and a housing and wherein the respective first tabs project outwardly from the sidewall and include upper edges that are engaged by the housing, causing the shield to be urged towards the circuit board where the spring contacts engage the conductive strip.

2. The electromagnetic shield of claim 1 wherein the shield includes a group of second tabs that project outwardly from the side wall and which are interposed between the respective spring contacts and wherein the second tabs also include upper edges that are engaged by the housing.

3. The electromagnetic shield of claim 1 wherein the spring contacts project inwardly of the side wall.

4. The electromagnetic shield of claim 1 wherein the spring contacts are generally aligned with the side wall.

5. The electromagnetic shield of claim 1 wherein the spring contacts project outwardly of the sidewall.

6. An electromagnetic shield adapted to be installed between the printed circuit board, having a conductive strip thereon, and a housing, comprising:
    a) a face;
    b) a side wall extending around at least a portion of the face;
    c) series of spaced apart spring contacts extending from the side wall, each spring contact including a first tab projecting outwardly from the side wall and a finger integral with the first tab and extending therefrom for electrical contact with the conductive strip formed on the printed circuit board;
    d) the first tabs including upper bearing edges that are engaged by the housing, causing the shield to be urged towards the printed circuit board where the spring contacts engaged the conductive strip formed on the printed circuit board; and
    e) wherein the shield including the face, the side wall, and the spring contacts constitutes an integral one-piece structure formed of an electrically conductive material.

7. The electromagnetic shield of claim 6 wherein the shield includes a group of second tabs that project outwardly from the side wall, the second tabs being interposed between the respective first tabs and forming an integral one-piece construction with the face, side wall and spring contacts.

8. The electromagnetic shield of claim 7 wherein the first and second tabs project outwardly from the plane of the side wall and form consecutive sets of tabs.

9. The electromagnetic shield of claim 8 wherein the tabs of each set are interconnected by a segment of the side wall.

10. The electromagnetic shield of claim 8 wherein the tabs of each set include upper edges that project outwardly from the side wall and wherein the shield may be urged towards the printed circuit board by the engagement of the upper edges of the tabs with a bearing surface.

11. The electromagnetic shield of claim 10 wherein the shield is installed in a radiotelephone between a circuit board and a housing, and wherein the housing engages the upper edges of the tabs and effectively presses the electromagnetic shield against the circuit board.

12. The electromagnetic shield of claim 6 wherein the shield is constructed of beryllium-copper.

13. The electromagnetic shield of claim 6 wherein the side wall and spring contacts define a series of openings around the shield when the shield is installed over a printed circuit board.

14. The electromagnetic shield of claim 13 wherein the largest dimension of the respective openings is less than 6 millimeters.

15. The electromagnetic shield of claim 6 wherein the fingers of the spring contacts are essentially centered with the side wall.

16. The electromagnetic shield of claim 6 wherein there is provided a first fold line between the side wall and respective first tabs and a second fold line between the first tabs and the fingers extending from the first tabs.

17. The electromagnetic shield of claim 16 wherein the fingers are angled with respect to the first tabs and are capable of flexing up and down relative to the face of the shield.

18. The electromagnetic shield of claim 6 wherein the shield including the face, side wall and spring contacts is cut and formed in a progressive die cutting operation.

19. A radiotelephone having an electromagnetic shield disposed therein, comprising:
   a) a printed circuit board having an electrical circuit formed therein and a conductive strip extending around the electrical circuit;
   b) an electromagnetic shield disposed adjacent the printed circuit board for isolating the electrical circuit disposed on the printed circuit board, the electromagnetic shield comprising:
      1) a face;
      2) a side wall extending around at least a portion of the face;
      3) a series of spaced apart spring contacts extending from the side wall of the shield for electrical contact with the conductive strip disposed on the printed circuit board, the spring contacts being flexible and vertically movable up and down relative to the face of the shield;
      4) each spring contact including a first tab that projects out of the plane of the sidewall and a finger that extends from the first tab and wherein the first tab includes and upper edge;
      5) wherein the shield including the face, side wall and spring contacts constitute an integral one-piece structure formed of an electrical conductive material; and
   d) a housing structure disposed adjacent the shield and generally enclosing the shield about the printed circuit board, and wherein the housing engages the upper edges of the tabs and effectively presses the shield into contact with the printed circuit board, resulting in the spring contacts engaging the conductive strip extending around the printed circuit board.

20. The radiotelephone of claim 19 wherein there is defined a series of openings between the shield and the printed circuit board.

21. The radiotelephone of claim 20 wherein the openings are sized such that the longest dimension of a respective opening is less than approximately 6 millimeters.

22. The radiotelephone of claim 19 wherein the electromagnetic shield is constructed of beryllium-copper.

23. The radiotelephone of claim 19 wherein the shield includes a group of second tabs spaced around the side wall and interposed between the spring contacts, and wherein the second tabs project outwardly from the side wall generally parallel to the first tabs of the spring contacts.

24. The radiotelephone of claim 23 wherein the first tabs and second tabs include upper edges that project outwardly from the side wall and wherein the shield may be urged towards the printed circuit board by the housing engaging the upper edges of the first and second tabs and pressing the tabs towards the printed circuit board.

25. The radiotelephone of claim 24 wherein there is provided a first fold line between the side wall and respective first tabs and a second fold line between the first tabs and the fingers extending therefrom, and wherein the fingers are angled with respect to the first tabs and are capable of flexing up and down relative to the face of the shield.

26. The radiotelephone of claim 19 wherein each spring contact includes a finger that is essentially aligned with the side wall.

27. A radiotelephone having an electromagnetic shield disposed therein, comprising:
   a) a printed circuit board having an electrical circuit formed thereon and a conductive strip extending about the printed circuit board;
   b) an electromagnetic shield disposed adjacent the printed circuit board for isolating the electrical circuit disposed on the printed circuit board, the electromagnetic shield comprising:
      1) a face;
      2) a side wall angled with respect to the face and extending around at least a portion of the face;
      3) a series of spaced apart spring contacts extending from the side wall, each spring contact including a first tab having an upper edge projecting outwardly from the side wall and a finger integral with the first tab and extending therefrom for electrical contact with the conductive strip formed on the printed circuit board; and
   c) a housing enclosing the shield and including a bearing surface for engaging the upper edges of the first tabs and urging the shield towards the printed circuit board such that the spring contacts engage the conductive strip extending on the printed circuit board.

28. The radiotelephone of claim 27 wherein the first tabs are cut from the side wall of the shield and folded so as to project outwardly from the shield.

29. The radiotelephone of claim 27 wherein the face, the side wall, and the spring contacts are all integral.

30. The radiotelephone of claim 29 wherein the electromagnetic shield is constructed of beryllium-copper.

31. The radiotelephone of claim 27 wherein there is formed a series of openings in the side wall of the shield.

32. The radiotelephone of claim 31 wherein the longest dimension of a respective opening is less than approximately 6 millimeters.

33. The electromagnetic shield of claim 27 wherein a group of second tabs project from the side wall of the shield and wherein the second tabs are interposed between the first tabs.

34. The electromagnetic shield of claim 33 wherein consecutive pairs of the first and second tabs form sets.

35. The electromagnetic shield of claim 34 wherein each set of tabs project outwardly from the plane of the side wall of the shield such that the tabs of the set face each other.

36. The radiotelephone of claim 27 including at least one side spring contact that projects outwardly from the side wall of the shield for electrically engaging and grounding a structure of the radiotelephone.

37. An electromagnetic shield for shielding an electrical circuit disposed on a circuit board having a conductive strip extending around the electrical circuit, comprising:

a) a face;

b) a side wall extending around at least a portion of the face;

c) a series of spring contacts extending from the sidewall for electrical contact with the conductive strip extending around the circuit board, the spring contacts being flexible and movable up and down relative to the face of the shield and forming an integral one-piece construction with the sidewall; and d) wherein the integral one-piece construction formed by the sidewall and each spring contact includes a tab and a finger cut from the sidewall with the tab being bent such that it projects outwardly from the plane of the sidewall and the finger depends from the bent tab.

38. The electromagnetic shield of claim 37 wherein there is provided a fold line between the tab and the finger that permits the finger to flex up and down relative to the face of the shield.

39. The electromagnetic shield of claim 37 including a series of second tabs that are cut from the side wall of the shield and which project outwardly from the plane of the side wall.

* * * * *